United States Patent [19]
Fischer et al.

[11] Patent Number: 5,969,951
[45] Date of Patent: Oct. 19, 1999

[54] METHOD FOR MANUFACTURING A CHIP CARD AND CHIP CARD MANUFACTURED IN ACCORDANCE WITH SAID METHOD

[75] Inventors: Dirk Fischer, Paderborn; Lothar Fannasch, Bielefeld, both of Germany

[73] Assignee: ORGA Kartensysteme GmbH, Paderborn, Germany

[21] Appl. No.: 09/041,750

[22] Filed: Mar. 13, 1998

[30] Foreign Application Priority Data

Mar. 13, 1997 [DE] Germany .................. 197 10 144

[51] Int. Cl.[6] .................. H05K 1/11; H05K 1/14
[52] U.S. Cl. .................. 361/737; 361/809; 361/820; 235/492; 257/679
[58] Field of Search .................. 361/727, 737, 361/761, 782, 807, 811; 235/487, 488, 492; 257/679; 455/269

[56] References Cited

U.S. PATENT DOCUMENTS

| 5,880,934 | 3/1999 | Haghiri-Tehrani | 361/737 |
|---|---|---|---|
| 5,888,624 | 3/1999 | Haghiri et al. | 428/195 |

FOREIGN PATENT DOCUMENTS

| 0 495 216 | 7/1992 | European Pat. Off. . |
|---|---|---|
| 521 778 | 1/1993 | European Pat. Off. . |
| 0 328 124 | 8/1993 | European Pat. Off. . |
| 0 702 325 | 3/1996 | European Pat. Off. . |
| 0 742 533 | 11/1996 | European Pat. Off. . |
| 41 32 720 | 4/1993 | Germany . |
| 296 04 946 U | 9/1995 | Germany . |
| 295 03 249 U | 12/1995 | Germany . |
| 44 19 973 | 12/1995 | Germany . |
| 97/36009 | 11/1996 | WIPO . |
| 97/31334 | 8/1997 | WIPO . |

OTHER PUBLICATIONS

Carrier Card for an Integrated Circuit for GSM–System–Mobile Telephone, pp. 1–7.

*Primary Examiner*—Leo P. Picard
*Assistant Examiner*—Jayprakash N. Gandhi
*Attorney, Agent, or Firm*—Foley & Lardner

[57] ABSTRACT

A method for manufacturing a chip card comprising a multi-layer plastic card body; an integrated circuit arranged within a chip module; at least one coil which serves for the energy supply and/or the data exchange between the integrated circuit with external devices, with the chip module having at least two metallic contacts for an electrically conducting connection of the integrated circuit with the terminals of the coil arranged on a coil carrier layer, comprising the steps of: providing the coil carrier layer with the coil and the coil terminals being arranged on same; providing a cover layer to be applied onto the coil carrier layer on the side of the coil terminals, with the cover layer comprising recesses which correspond to the coil terminals; providing at least one thickness compensation layer to be applied onto the cover layer; stacking of the card layers in registered relationship, with the cover layer being positioned in such a manner that each of the recesses in the cover layer comes to lie in the area of the coil terminals; placing the stacked card layers into a lamination press where the card layers are combined with each other under pressure and heat whereby during lamination synthetic material compound of the coil carrier layer is pressed into the recesses of the cover layer raising the coil terminals; removal of the laminated cards from the lamination press; recess milling of a recess for accommodating the chip module in the laminated card body, whereby the raised coil terminals are exposed; and fitting the chip module into the recess of the card body and making an electrically conducting connection between the contacts of the chip module and the coil terminals.

16 Claims, 8 Drawing Sheets

METHOD FOR MANUFACTURING A CHIP CARD AND CHIP CARD MANUFACTURED IN ACCORDANCE WITH SAID METHOD

FIELD OF THE INVENTION

The invention relates to a method for manufacturing a chip card. In particular, the invention relates to a method for manufacturing contactless chip cards. It lends itself, however, without any limitation to the manufacture of a combination chip card (contactless and contact-operated).

BACKGROUND OF THE INVENTION

Chip cards are already employed on a large scale in the form of telephone cards, access authorization cards for cellular telephones, bank cards, etc. The energy supply and the data exchange between the card and external devices are effected with these cards via touch contact (galvanically) between metallic contact areas arranged on the card and corresponding contacts in the respective devices.

In addition to these contact-operated cards, so-called contactless cards are also increasingly employed where the energy supply and the data exchange of the integrated circuit of the card is effected inductively via a coil which is embedded in the card.

In the manufacture of contactless chip cards the coil must be embedded into the card body. To this end the coil, which is arranged on a coil carrier layer with its coil terminals, is laminated between the coil carrier layer and one or several card layers which are arranged above it.

The coil (conductor paths and coil terminals/large area coil ends) is preferably etched from an electrically conducting (preferably copper) coated plastic foil. Here, the plastic foil constitutes the coil carrier layer, or the plastic foil with the etched coil may be combined with another plastic layer to form the coil carrier layer. In alternative configurations, a wire wound coil is glued onto the coil carrier layer or partially pressed into same ultrasonically in order to locate it in its position. In a further embodiment the coil is applied to the coil carrier layer as an electrically conducting layer in accordance with the silk-screen printing method. It is also possible to apply the coil in the form of an electrically conducting layer in accordance with the hot embossing method.

Regardless of the embodiment of the coil and the way of applying it onto the coil carrier layer, a recess for accommodating a chip module which contains the integrated circuit (semiconductor element/chip) and which comprises metallic contacts for connecting the chip with the coil terminals is machined into the finish laminated card. This exposes the coil terminals so that the electrically conducting connection with the corresponding contacts of the chip module can be made by means of a conducting adhesive or a soldering material.

Thereby, however, serious drawbacks are encountered. When milling the recess, not only are the coil terminals exposed but also the coil windings/conductor paths extending between the coil terminals, i.e., if the coil comprises N number of windings, N-1 number of windings extend between the coil terminals. This leads to the following problems:

a) The conductor paths of the coil, which extend in the height of the coil terminals and which have a width of approximately 80 $\mu$m only, tend to be damaged very easily or severed completely during milling so that the coil quality deteriorates or the coil is even destroyed totally. This is not so critical with the large area coil terminals (>1 mm$^2$) because in this case, a "scratch" has no consequences.

b) In the manufacture of an electrically conducting connection between the contacts of the chip module and the coil terminals an electric short circuit is easily caused between the conductor paths of the coil or between the conductor paths and the coil terminals, respectively, by the conductive adhesive or the soldering material due to the fact that the distance between the conductor paths and the distance between the conductor path(s) and the coil terminals is very small, thus rendering the coil useless. In most cases it is not possible to change the arrangement of the coil (conductor paths and coil terminals) on the coil carrier layer so as to increase the distances between the conductor path(s) which extend between the coil terminals in the area of the recess and the coil terminals, in order to prevent a short circuit because the coil carrier layer, is machined in a centre area between the coil terminals for the accommodation of parts of the chip module so that conductor paths in that area would be destroyed. In order to avoid short circuits to and between the conductor paths a solder blocking varnish would have to be applied in a labor and cost intensive manner, or an insulating layer would have to be applied to the conductor paths in a similarly labor and cost intensive manner. In this case, too, there is the problem that the coatings and the conductor paths themselves would be destroyed by milling.

SUMMARY OF THE INVENTION

In view of this background, it is an object of the invention to develop a method for the manufacture of contactless chip cards of the above mentioned type which ensures the reliable manufacture of contactless chip cards with a minimum of rejects and which, in addition, is economically viable.

Briefly, the present invention comprises a method for manufacturing a chip card including a multi-layer plastic card body;

an integrated circuit arranged within a chip module;

at least one coil arranged on a coil carrier layer, said coil serving for the energy supply and/or the data exchange between the integrated circuit and external devices, with the chip module having at least two metallic contacts for an electrically conducting connection of the integrated circuit with terminals of the coil, comprising the steps of:

a) providing the coil carrier layer with the coil and the coil terminals being arranged on same;

providing a cover layer to be applied onto the coil carrier layer on the side of the coil terminals, with the cover layer comprising recesses which correspond to the location of the coil terminals;

providing at least one thickness compensation layer to be applied onto the cover layer;

b) stacking of said layers in registered relationship, with the cover layer being positioned in such a manner that each of the recesses in the cover layer comes to lie in the area of the coil terminals);

c) placing the stacked card layers into a lamination device where the card layers are combined with each other under pressure and heat whereby during lamination synthetic material compound of the coil carrier layer is pressed into the recesses of the cover layer, raising the coil terminals;

d) removal of the laminated cards from the lamination press;

e) recess milling of a recess for accommodating a chip module in the laminated card body, whereby the raised coil terminals are exposed; and f) fitting the chip module into the recess of the card body and making an electrically conducting connection between the contacts of the chip module and the coil terminals.

In a yet further aspect of the present invention, a chip card including a multi-layer card body with a recess is provided comprising:

a coil carrier layer with a coil, coil/conductor paths and coil terminals arranged thereon, with the coil carrier layer in the area of the coil terminals being designed so as to be raised at least partially by the formation of hump-type elevations;

a cover layer which is arranged on the coil carrier layer so as to completely cover the coil/conductor paths, with the hump-type elevations of the coil carrier layer in the area of the coil terminals being positively arranged to protrude into openings of the cover layer;

one thickness compensation layer arranged on the cover layer, with a chip module including an integrated circuit with contacts which provide for the connection of the integrated circuit with the coil terminals being fixed in openings in the cover layer of the card body, in which the raised coil terminals are exposed, and with the contacts of the chip module being connected with the coil terminals in an electrically conducting manner.

The dependent claims include further advantageous and beneficial embodiments of the method.

The inventive method will be explained in more detail and its advantages shown with reference to the accompanying drawings.

DETAILED DESCRIPTION OF THE PREFERRED EMBODIMENT

Figure 10:
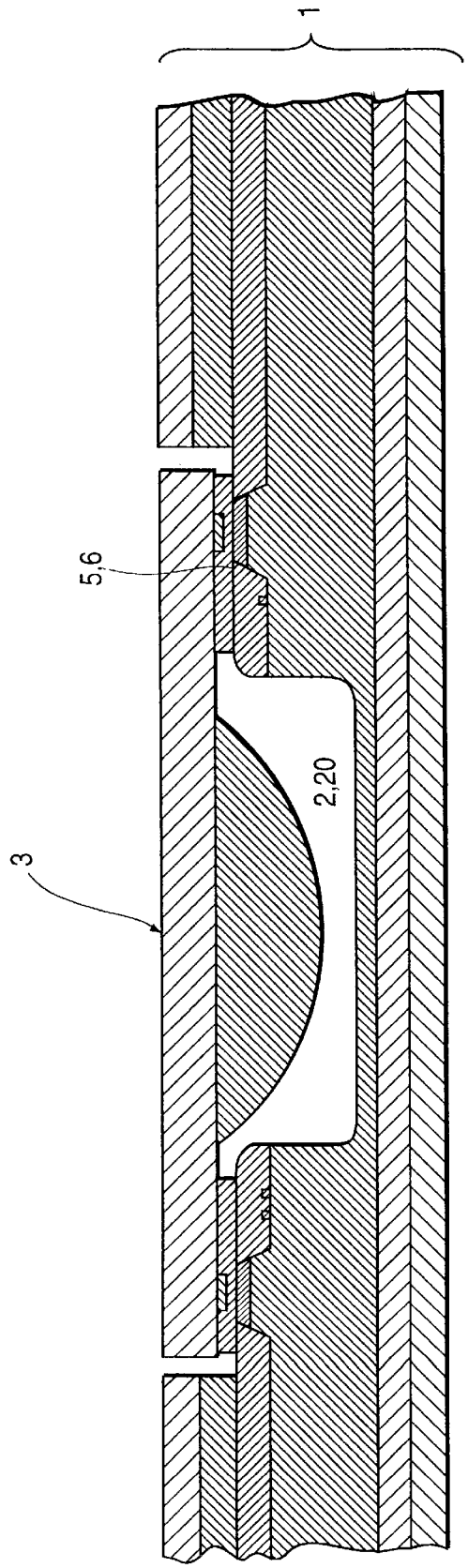
FIG. 10 shows a section through a finished card with the chip module implanted.

Referring to the figures, the invention discloses a method for manufacturing a chip card which comprises a multi-layer plastic card body (1), an integrated circuit (semiconductor element/chip 31) (see FIG. 11) arranged on a chip module (3) and at least one coil (10A) which provides for an energy supply and/or the data exchange between the integrated circuit (31) and external devices. The chip module (3) (FIGS. 10–11) comprises at least two metallic contacts (32, 32*) for an electrically conducting connection between the integrated circuit (31) and terminals (10A1, 10A1*) of the coil (10A), which are arranged on a coil carrier layer (10).

The invention relates in particular to a method for manufacturing chip cards in accordance with the ISO 7810 format with a card thickness of (760±8) $\mu$m.

Figure 4:
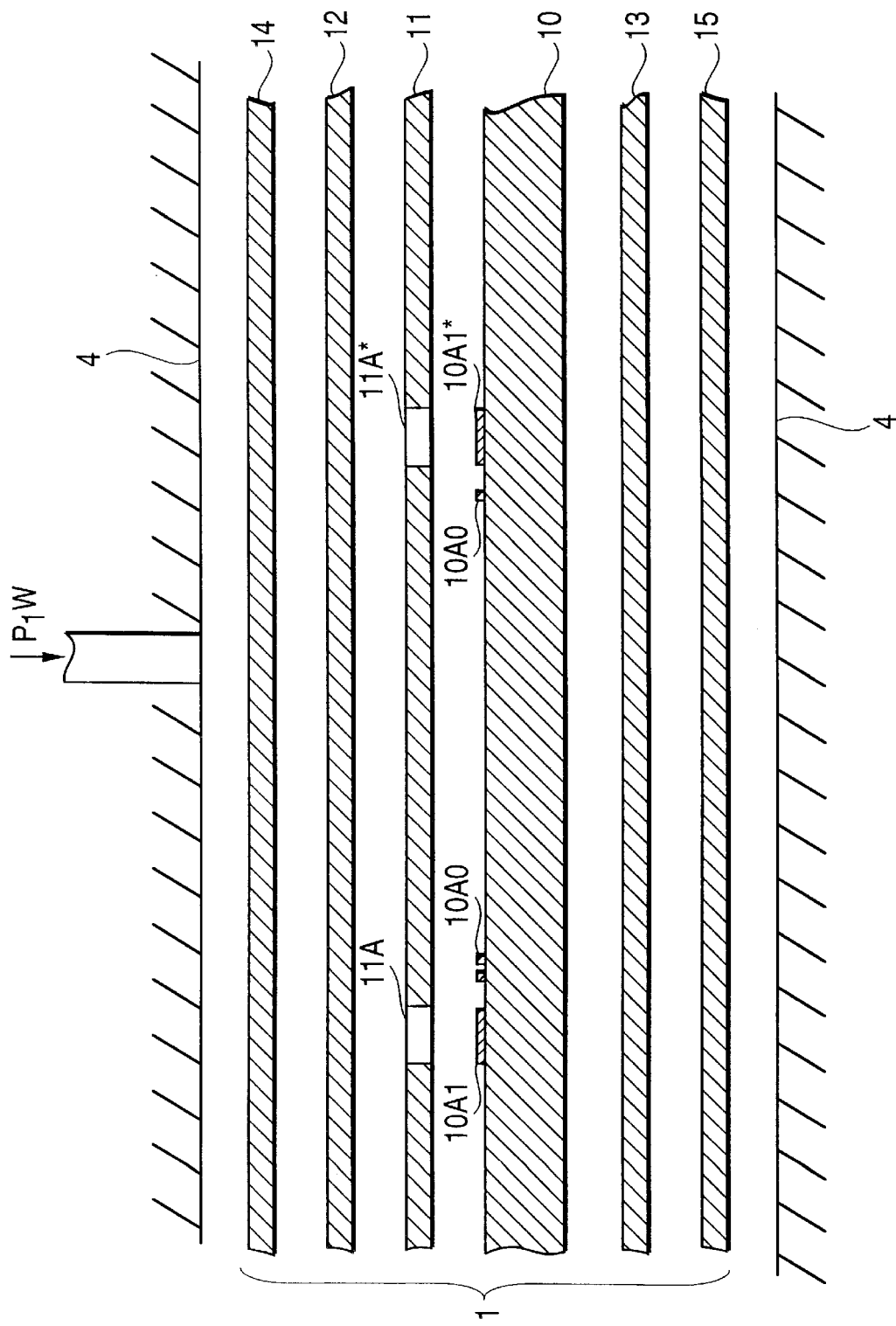
FIG. 4 shows the various card layers prior to laminating.
Figure 5:
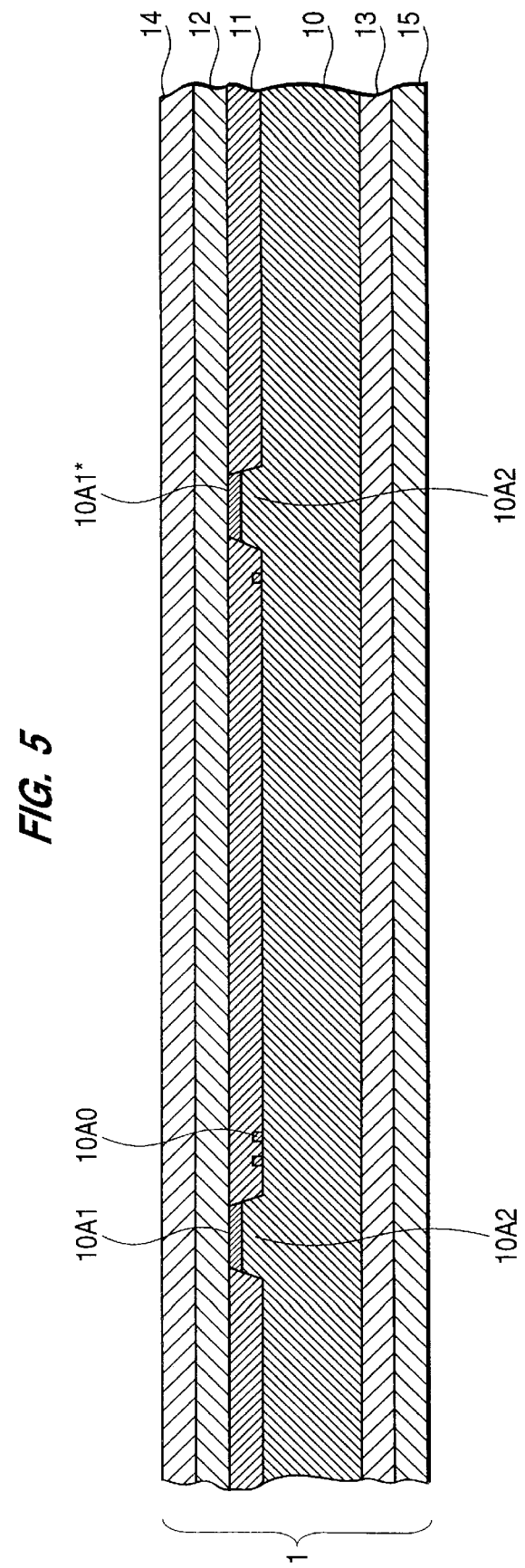
FIG. 5 shows a section through a finish laminated card.

For the card to be manufactured, six card layers of the shown embodiment are combined with each other by lamination as shown in FIG. 4:

the coil carrier layer (10) and the coil (10A) arranged thereon with its coil conductor paths (10A0) and the coil terminals (10A1, 10A1*); a cover layer (11) to be applied onto the coil carrier layer (10) at the coil terminal side; a thickness compensation layer (12) onto the cover layer (11); a cover layer (overlay 14) on the card front side; a thickness compensation layer (13) which is applied to coil carrier layer (10) on the side facing away from the coil terminals; and a cover layer (15) on the card rear side.

For the thickness compensation layers (12, 13) printed plastic foils are employed while for the card cover layers (14, 15) to be applied above same, transparent overlay foils are used.

The inventive method, however, can also be carried out with only three card layers, i.e., the coil carrier layer (10), the cover layer (11) and the thickness compensation layer (13) arranged above same. In order to achieve the standard card thickness, the thicknesses of the individual card layers are selected accordingly and matched to each other.

For the manufacture of the laminated card body according to the invention with the so-called multiple copy production method—in contrast to individual card manufacture-may be employed, with the throughput being considerably higher than in individual card manufacture. In the multiple-copy production method, multiple-copy sheets (coil carrier sheets, cover layer sheets, thickness compensation sheets, etc.) each with a plurality of individual elements (coil carrier layers, cover layers, thickness compensation layers, etc.) are employed for the manufacture of a plurality of laminated card bodies. After lamination, the individual card bodies are punched from the sheet. Both in individual card manufacture as well as in multiple-copy production the layers or sheets, respectively, must be stacked in a registered relationship prior to lamination.

It makes no difference whether individual card manufacture or multiple-copy production is employed for the inventive method.

According to the invention the cover layer (11) to be applied onto the coil carrier layer (10) comprises recesses (11A, 11A*) which correspond to the coil terminals (10A1, 10A1*), with the cover layer (11) being positioned above the coil carrier layer (10) in such a manner that each of the recesses (11A, 11A*) comes to lie in the area of the coil terminals (10A1, 10A1*). During lamination of the layers (10, 11, 12, 13, 14, 15) in a lamination press (4)—see FIG. 4—the card layers are joined to each other under the influence of pressure and heat. It is an advantage of the invention that during lamination synthetic material compound of the coil carrier layer (10) is pressed into the recesses (11A, 11A*) of the cover layer (11) after raising the coil terminals (10A1, 10A1*). The coil terminals (10A1, 10A1*) are thus raised in a hump-type manner by means of hump (10A2) relative to the remaining coil carrier layer (10) and the conductor paths (10A0) of the coil (10A).

After removal of the laminated cards from the lamination press (4)—in the case of the multiple-copy production method the additional process step of punching the individual cards is to be considered a recess (2) (see FIG. 6) for accommodating the chip module (3) is milled into the laminated card body (1) in a recess milling plant (not shown). Thereby the raised coil terminals (10A1, 10A1*) are exposed while the lower conductor paths (10A0) of the coil (10A) also between the coil terminals are arranged below the cover layer (11) so as to be protected and insulated.

Due to the inventive raising of the coil terminals (10A1, 10A1*) relative to the coil conductor paths (10A0), which for contact-making with the chip module (3) have to be exposed by milling, it is prevented that the conductor paths (10A0) are damaged or completely destroyed during the exposing machining of the coil terminals (10A1, 10A1*).

Moreover, the risk of a short circuit to coil conductor path (10A0), when making an electrically conducting connection between the contacts (32, 32*) of the chip module (3) and the coil terminals (10A1, 10A1*) by means of a conducting adhesive or soldering material, is avoided in an advantageous manner because the coil conductor paths (10A0) are separated from the coil terminals (10A1, 10A1*) by the insulating cover layer (11).

The initially mentioned problems in the manufacture of contactless chip cards are thus eliminated by the method according to the invention. Here, a reliable manufacturing method for contactless chip cards with a minimum number of rejects has been created.

In order to enhance raising of the coil terminals (10A1, 10A1*) a synthetic material is used for the coil carrier layer (10), which material has a lower stability of shape under the influence of pressure and heat than that of the cover layer (11) and the thickness compensation layer (12) arranged above same. The lower stability of shape of the coil carrier layer (10) is reflected in a lower Vicat softening temperature. This can be achieved, for example, by mixing filler particles into the synthetic material (e.g. titanium dioxide) which increase the stability of shape, with the filler concentration of the coil carrier layer (10) being lower than that of the remaining layers (11, 12) so that a lower stability of shape of the coil carrier layer (10) is obtained. In a preferred embodiment the card layers consist of thermally non-recrystallizing polyester (polyethyleneterephthalate; PETG). This material can be recycled or disposed of in an environmentally friendly manner.

Instead of using one card material for all card layers, though with fewer filler particles in the coil carrier layer (10), it is also possible to use a synthetic material for the coil carrier layer (10) which is completely different from that of the cover layer (11) and the thickness compensation layer (12) e.g., PVC for the coil carrier layer (10) and polycarbonate (PC) for the cover layer (11) and the thickness compensation layer (12). Depending on the PVC type the Vicat softening temperatures of PVC range from approximately 70° C. to 80° C. while the Vical softening temperatures of PC range from approximately 120° C. to 130° C. depending on the type used.

The thickness of the coil terminals (10A1, 10A1*) as well as of the coil conductor paths (10A0) is typically in the range of 20 to 80 μm. The thickness of the cover layer (11) is typically in the range of 40 to 200 μm. In each case the thickness of the coil terminals is smaller than the thickness of the cover layer.

Figure 1:
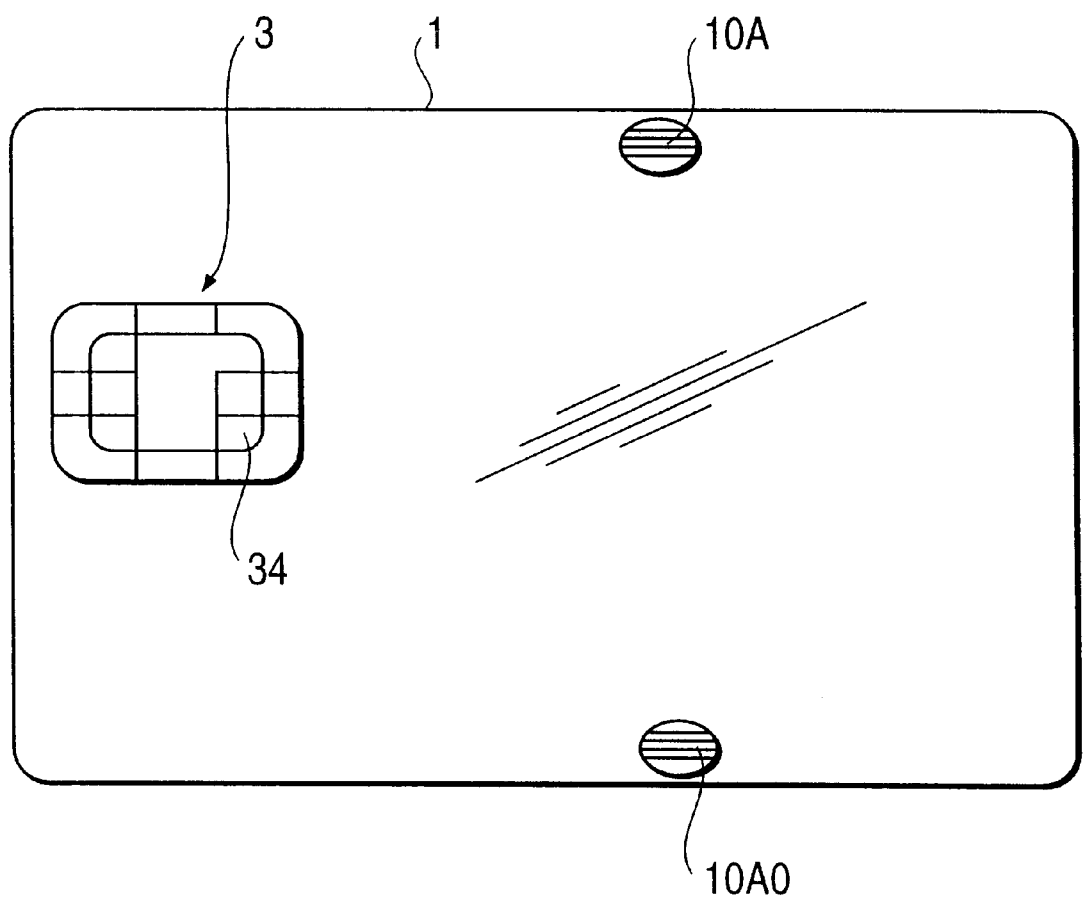
FIG. 1 is a plan view of the inventive chip card with the surface shown broken away in two places for visualizing the coil conductor paths.
Figure 2:
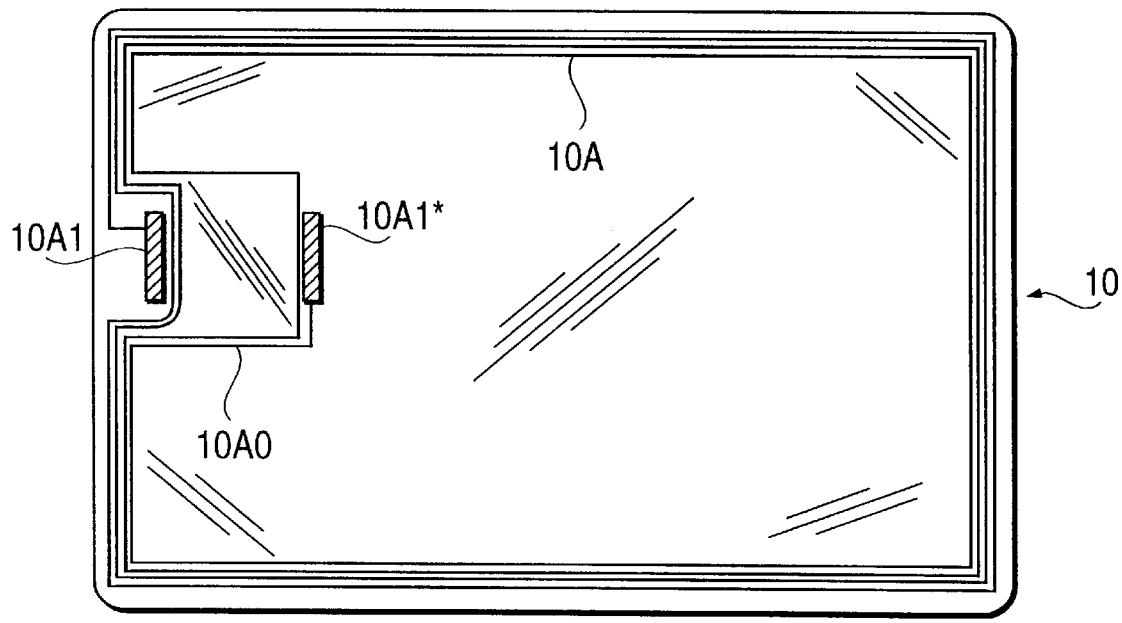
FIG. 2 is a plan view of the coil carrier layer.
Figure 3:
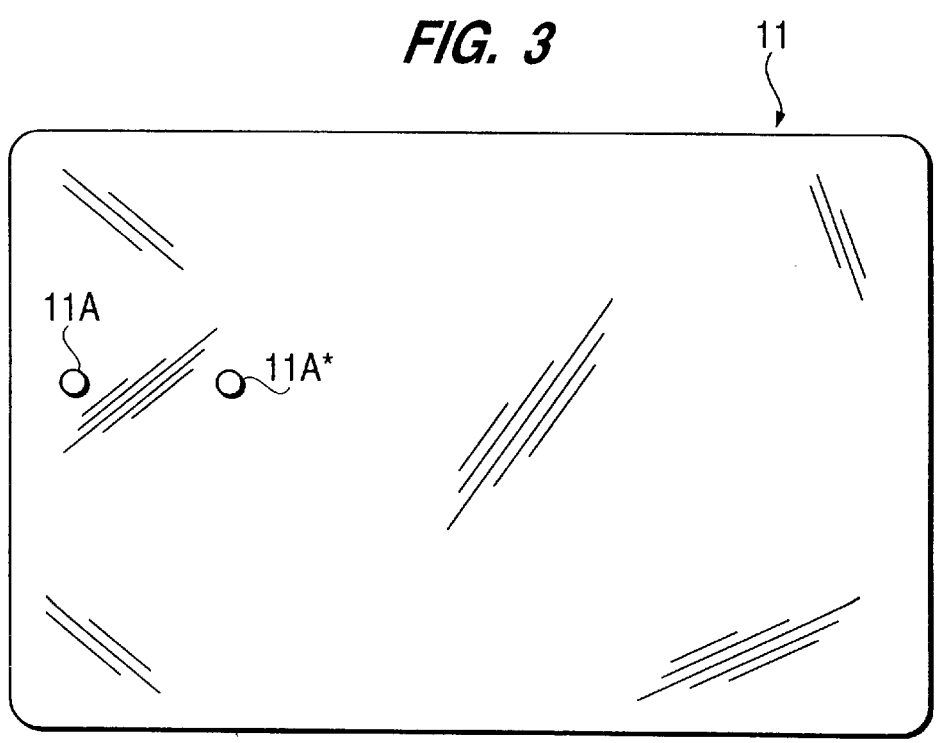
FIG. 3 is a plan view of the cover layer with recesses corresponding to the coil terminal.

FIGS. 2 and 3 show a plan view of the coil carrier layer (10) and of the cover layer (11), respectively. The coil terminals (10A1, 10A1*) of this embodiment are designed with an elongated shape and have a width of approximately 1.5 mm and a depth of approximately 8 mm (the drawings are not true to scale). The recesses (11A, 11A*) of the cover layer (11) are preferably of a circular shape with a diameter which approximately corresponds to the width of the coil terminals (10A1, 10A1*). The cover layer (11) with its recesses (11A, 11A*) is positioned to be centered with respect to the width of the coil terminals. This ensures that the conductor paths (10A0), too, between the coil terminals (10A1, 10A1*) are completely covered by the cover layer (11). In the illustrated example the recesses of the cover layer are arranged also in the longitudinal direction and centered above the coil terminals. It is, however, also possible to use cover layers with another position of the recesses relative to the longitudinal direction of the coil terminals if the arrangement of the contacts (32, 32*) at the chip module (3) requires another position of the raised exposed coil terminals (10A1, 10A1*).

Figure 6:
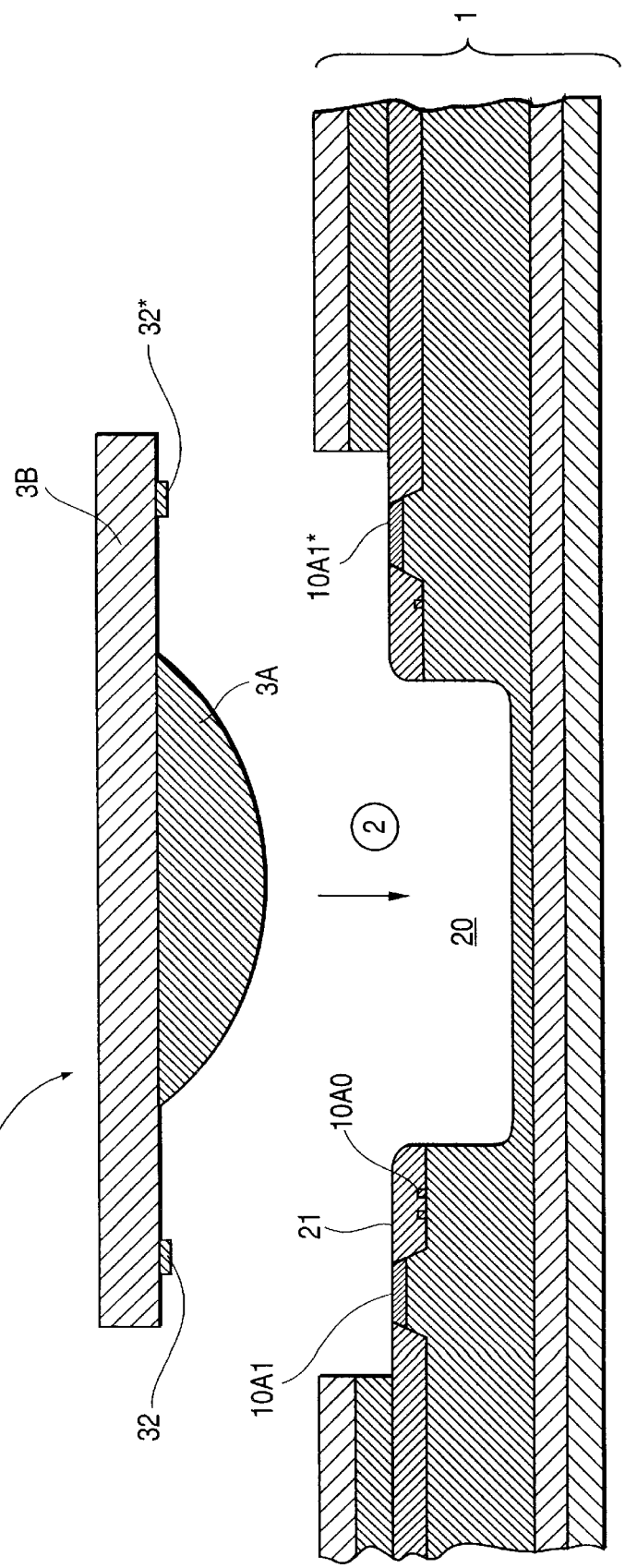
FIG. 6 shows a section through a card with a machine d recess as well as a section through the chip module to be fitted.
Figure 11:
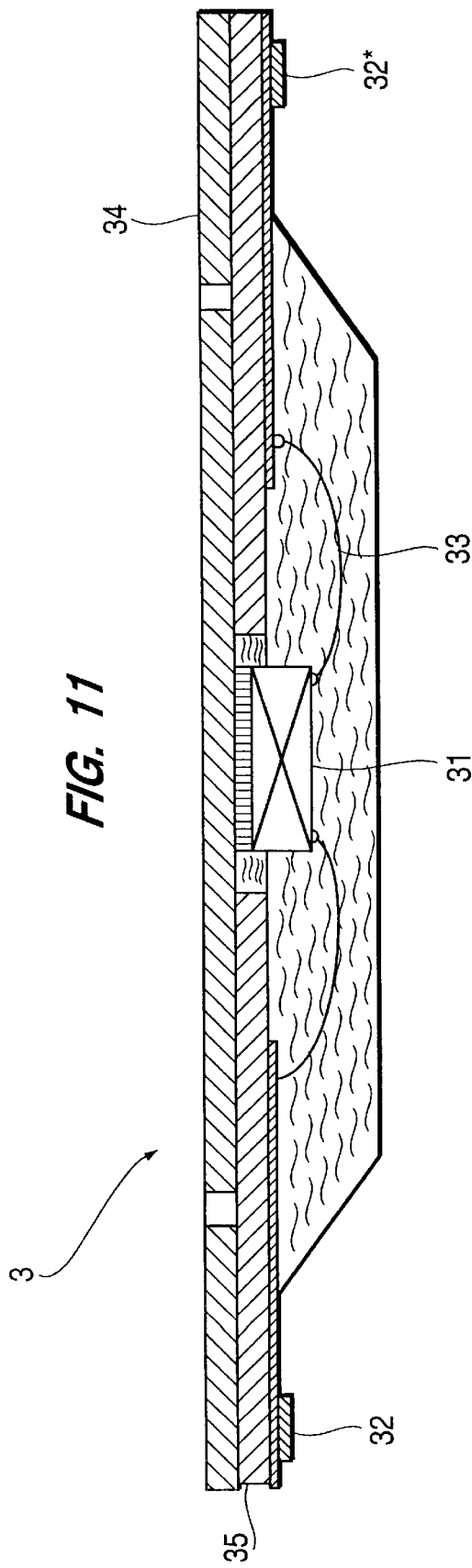
FIG. 11 shows a section through the chip module with more detail information visible.

The chip module (3) see also FIGS. 6 and 11—used for this chip card comprises of a first part in the form of a molded housing (3A) comprising the integrated circuit (31) and the connecting lines (33) from the integrated circuit (31) to the metallic contacts (32, 32*) for the connection with the coil terminals (10A1, 10A1*) and of a second part (3B) which protrudes beyond the edge of the molded housing (3A) and comprises the metallic contacts (32, 32*) for the connection with the coil terminals. FIG. 11 shows this chip module (3) in more detail. Here, a chip module (3) is illustrated which enables both a contactless as well as a contact-operated function of the card. The metallic contact areas (34) for the touch-type operation of the card are arranged on the surface of the module carrier layer (e.g. a glass fibre reinforced epoxy resin layer 35). The connection between these contact areas (34) and the chip (31) is not visible in this sectional view. The contacts (32, 32*) for the connection with the coil terminals (10A1, 10A1*) are located on the rear side of the module carrier layer (35). They are designed as conductor paths which are extended into the molded housing (3A) where they are connected with the connection lines (bond wires 33) of the chip (31). The molded housing (3A) serves as a protection for the chip (31) and the thin connection lines (33).

The recess (2) for accommodating the chip module (3) is obtained by machining or by some other convenient method in accordance with the shape of the chip module (3) with two steps comprising an indentation (20) which is arranged centrally in the recess (2) and a supporting shoulder (21) which surrounds this indentation (20), with the exposed coil terminals (10A1, 10A1*) resting upon the supporting shoulders (21). The chip module (3) is then joined with the card body (1) via at least its second part (3B) which protrudes beyond the molded housing (3A) and rests upon the machined supporting shoulder (21), with an electrically conducting connection being made between the contacts (32, 32*) of the chip module (3) and the coil terminals (10A1, 10A1*).

When using very shallow chip modules the two-step recess with an additional centre indentation can be dispensed with.

The contacts (32, 32*) of the chip module (3) can be connected with the coil terminals (10A1, 10A1*) in an electrically conducting manner by means of a conductive adhesive (5), a soldering process or by means of heat sealing. The electrically conducting connection (e.g. when using special conductive adhesives) may also be sufficient for the mechanical positioning of the chip module (3) within the card body (1). The module, however, is preferably secured in the card body by means of additional adhesive connections.

Figure 7:
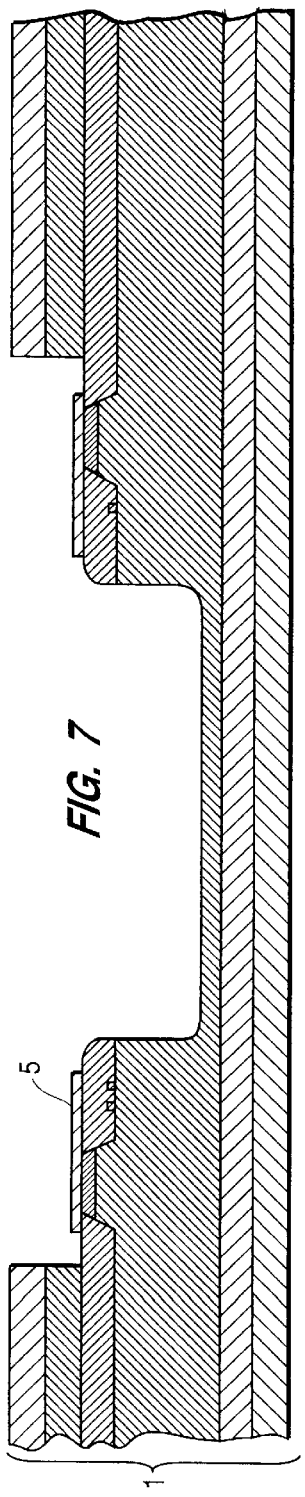
FIG. 7 shows a section through a card with a machined recess, with conductive adhesive from a dispenser applied to the supporting shoulder 21 for the connection of the coil terminals with the contacts of the chip module.
Figure 8:
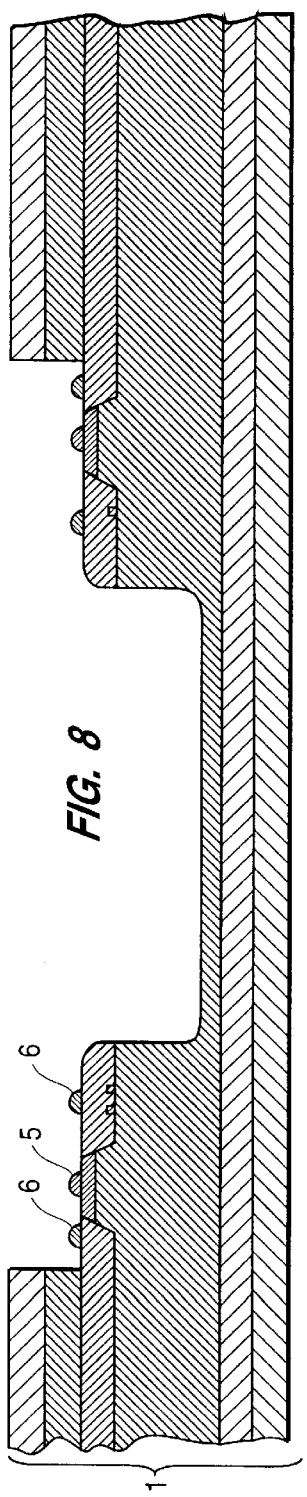
FIG. 8 shows conductive and non-conductive adhesive drops applied to the supporting shoulder 21 of the machined recess.
Figure 9:
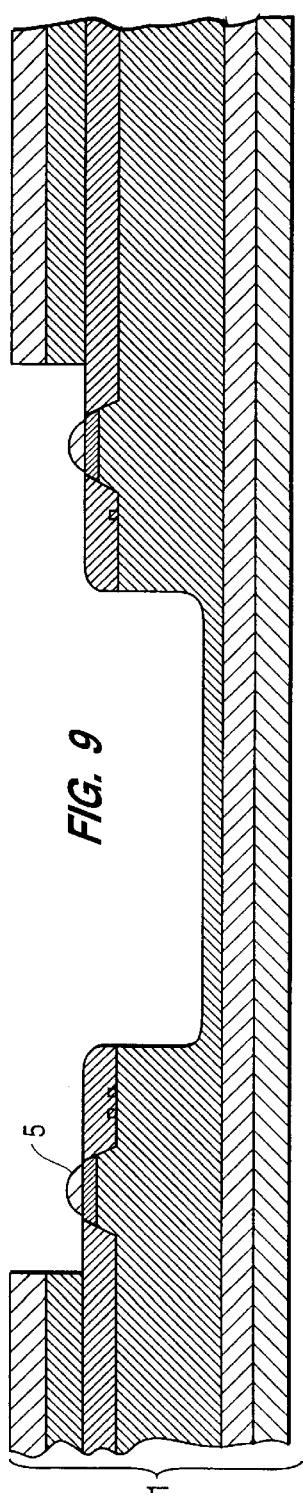
FIG. 9 shows a conductive adhesive for the connection of the coil terminals with the contacts of the chip module.

FIGS. 7 to 9 show different ways of applying a conductive adhesive (5). In FIG. 7 the conductive adhesive (5) is applied by means of a dispenser is such a manner that it completely covers an area which is larger than the exposed coil terminals (10A1, 10A1*). The control effort for the dispenser is advantageously low. As mentioned above, the occurrence of short circuits is prevented. As shown in FIGS. 8 and 9 only one drop each of conductive adhesive (5) is applied to the coil terminals (10A1, 10A1*). In FIG. 8 drops (6) of a non-conductive adhesive are applied additionally to the supporting shoulder (21) of the recess (2) for reliable fixing of the chip module (3) in the card body. The application of a heat sealing adhesive is also provided.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A chip card including a multi-layer card body with a recess, comprising:
   a coil carrier layer with a coil, coil/conductor paths and coil terminals arranged thereon, with the coil carrier layer in the area of the coil terminals being designed so as to be raised at least partially by the formation of hump-type elevations;
   a cover layer which is arranged on the coil carrier layer so as to completely cover the coil/conductor paths, with the hump-type elevations of the coil carrier layer in the area of the coil terminals being positively arranged to protrude into openings in the cover layer;
   one thickness compensation layer arranged on the cover layer,
   with a chip module including an integrated circuit with contacts which provide for the connection of the integrated circuit with the coil terminals fixed in the openings in the cover layer of the card body, wherein the raised coil terminals are exposed, and the contacts of the chip module are connected with the raised coil terminals in an electrically conducting manner.

2. A chip card according to claim 1, wherein said recess of said card body comprises a recess with two steps comprising an indentation which is arranged centrally in the recess, and a supporting shoulder which surrounds the indentation, with the exposed coil terminals being arranged on the supporting shoulder.

3. A chip card according to claim 1, wherein the coil carrier layer is formed from a synthetic material with a lower stability of shape under the influence of pressure and heat than synthetic material forming the cover layer.

4. A chip card according to claim 3, wherein said recess of said card body comprises a recess with two steps comprising an indentation which is arranged centrally in the recess, and a supporting shoulder which surrounds the indentation, with the exposed coil terminals being arranged on the supporting shoulder.

5. A chip card according to claim 3, wherein the coil carrier layer, the cover layer as well as the thickness compensation layer comprise the same synthetic material, with the synthetic material comprising filler particles which increase the stability of shape, but with the filler concentration of the coil carrier layer and thus the stability of shape of said layer being lower than that of the other layers.

6. A chip card according to claim 5, wherein the synthetic material is a thermally non-recrystallizing polyester.

7. A chip card according to claim 3, wherein the coil carrier layer comprises PVC and the cover layer and the thickness compensation layer comprise polycarbonate.

8. A chip card according to claim 3, wherein the thickness of the coil terminals on the coil carrier layer is in the range of about 20 to 80 $\mu$m.

9. A chip card according to claim 8, wherein the thickness of the cover layer is in the range of about 40 to 200 $\mu$m.

10. A chip card according to claim 1, further comprising a thickness compensation layer applied onto a side of the coil carrier layer facing away from the coil terminals.

11. A chip card according to claim 10, wherein the thickness compensation layer which is arranged on the cover layer and the thickness compensation layer which is arranged on the coil carrier layer are printed, and that on each of the printed thickness compensation layers is arranged a further transparent thickness compensation layer as a card cover layer.

12. A chip card according to claim 1, wherein the recess which is machined in the card body for accommodating the chip module is formed with two steps comprising an indentation which is arranged centrally in the recess and a supporting shoulder which surrounds this indentation, with the exposed coil terminals being arranged on the supporting shoulders, and a chip module is used which comprises a first part in the form of a molded housing which includes the integrated circuit and connection lines from the integrated circuit to the metallic contacts for the connection with the coil terminals and a second part which protrudes beyond the margin of the molded housing and includes metallic contacts for the connection with the coil terminals, with the chip module at least with its second part which protrudes beyond the molded housing resting upon the machined supporting shoulder being connected with the card body, with an electrically conducting connection being made between the contacts of the chip module and the coil terminals.

13. A chip card according to claim 1, wherein the contacts of the chip module are connected with the coil terminals via an electrically conductive adhesive.

14. A chip card according to claim 1, wherein the chip module is mechanically fixed in the card body by means of an adhesive connection in addition to the electrically conductive adhesive.

15. A chip card according to claim 1, wherein the contacts of the chip module are connected with the coil terminals in an electrically conducting manner by means of solder.

16. A chip card according to claim 1, wherein the chip module includes contacts for the electrical connection with the coil terminals; and contact areas are arranged on the side of the chip module which is opposite the contacts and which serve for a touch-type energy supply and/or a data exchange with external devices.

* * * * *